US009234937B2

(12) United States Patent
Eliyahu et al.

(10) Patent No.: US 9,234,937 B2
(45) Date of Patent: Jan. 12, 2016

(54) MEASURING PHASE NOISE IN RADIO FREQUENCY, MICROWAVE OR MILLIMETER SIGNALS BASED ON PHOTONIC DELAY

(75) Inventors: Danny Eliyahu, Pasadena, CA (US); Lute Maleki, Pasadena, CA (US); David Seidel, Alta Loma, CA (US)

(73) Assignee: Oewaves, Inc., Pasadena, CA (US)

( * ) Notice: Subject to any disclaimer, the term of this patent is extended or adjusted under 35 U.S.C. 154(b) by 874 days.

(21) Appl. No.: 13/442,786

(22) Filed: Apr. 9, 2012

(65) Prior Publication Data
US 2012/0195590 A1  Aug. 2, 2012

Related U.S. Application Data

(60) Division of application No. 12/889,398, filed on Sep. 23, 2010, now Pat. No. 8,155,914, which is a continuation-in-part of application No. 12/270,845, filed on Nov. 13, 2008, now Pat. No. 8,155,913.

(60) Provisional application No. 61/244,959, filed on Sep. 23, 2009, provisional application No. 61/333,665, filed on May 11, 2010, provisional application No. 61/002,918, filed on Nov. 13, 2007.

(51) Int. Cl.
*H04B 10/08* (2006.01)
*G01R 31/28* (2006.01)
*G01R 29/26* (2006.01)
*H04B 10/61* (2013.01)

(52) U.S. Cl.
CPC ............ *G01R 31/2824* (2013.01); *G01R 29/26* (2013.01); *H04B 10/61* (2013.01)

(58) Field of Classification Search
USPC ........................................................ 702/117
See application file for complete search history.

(56) References Cited

U.S. PATENT DOCUMENTS

| 5,204,640 | A | 4/1993 | Logan, Jr. |
| 5,220,292 | A | 6/1993 | Bianchini et al. |
| 5,495,500 | A | 2/1996 | Jovanovich et al. |
| 5,687,261 | A | 11/1997 | Logan |
| 5,723,856 | A | 3/1998 | Yao et al. |
| 5,751,747 | A | 5/1998 | Lutes et al. |
| 5,777,778 | A | 7/1998 | Yao |
| 5,917,179 | A | 6/1999 | Yao |
| 5,929,430 | A | 7/1999 | Yao et al. |
| 5,985,166 | A | 11/1999 | Unger et al. |
| 6,080,586 | A | 6/2000 | Baldeschwieler et al. |

(Continued)

FOREIGN PATENT DOCUMENTS

| JP | 2005201764 A | 7/2005 |
| WO | 01/96936 A1 | 12/2001 |

(Continued)

OTHER PUBLICATIONS

Braginsky, V.B., et al., "Quality-Factor and Nonlinear Properties of Optical Whispering-Gallery Modes," Physics Letters A, 137(7, 8):393-397, May 1989.

(Continued)

*Primary Examiner* — Tung S Lau
(74) *Attorney, Agent, or Firm* — Fish & Tsang LLP

(57) ABSTRACT

Techniques and devices for measuring phase noise in radio frequency (RF), microwave, or millimeter signals based on photonic delay.

4 Claims, 8 Drawing Sheets

(56) References Cited

U.S. PATENT DOCUMENTS

| | | |
|---|---|---|
| 6,178,036 B1 | 1/2001 | Yao |
| 6,203,660 B1 | 3/2001 | Unger et al. |
| 6,317,214 B1 | 11/2001 | Beckett et al. |
| 6,389,197 B1 | 5/2002 | Iltchenko et al. |
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 7,801,189 B2 | 9/2010 | Maleki et al. |
| 7,813,651 B2 | 10/2010 | Ilchenko et al. |
| 7,869,472 B2 | 1/2011 | Maleki et al. |
| 7,929,589 B1 | 4/2011 | Ilchenko et al. |
| 7,965,745 B2 | 6/2011 | Maleki et al. |
| 8,155,913 B2 * | 4/2012 | Eliyahu et al. ............... 702/117 |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0024787 A1 | 1/2008 | Kaertner et al. |
| 2008/0043784 A1 | 2/2008 | Wilcox |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |
| 2009/0142076 A1 | 6/2009 | Li et al. |
| 2009/0208205 A1 | 8/2009 | Eliyahu et al. |
| 2009/0251705 A1 | 10/2009 | Le et al. |
| 2009/0310629 A1 | 12/2009 | Maleki et al. |
| 2009/0324251 A1 | 12/2009 | Ilchenko et al. |

FOREIGN PATENT DOCUMENTS

| | | |
|---|---|---|
| WO | 02/25783 A2 | 3/2002 |
| WO | 2005/008296 A2 | 1/2005 |
| WO | 2005/038513 A2 | 4/2005 |
| WO | 2005/055412 A2 | 6/2005 |
| WO | 2005/067690 A2 | 7/2005 |
| WO | 2005/122346 A2 | 12/2005 |
| WO | 2006/076585 A2 | 7/2006 |
| WO | 2006/099616 A2 | 9/2006 |
| WO | 2007/143627 A2 | 12/2007 |
| WO | 2008154656 A2 | 12/2008 |
| WO | 2009/064478 A2 | 5/2009 |
| WO | 2009064935 A2 | 5/2009 |
| WO | 2009114163 A2 | 9/2009 |
| WO | 2011038166 A2 | 3/2011 |

OTHER PUBLICATIONS

Eliyahu, D., et al., "Low Phase Noise and Spurious Levels in Multi-Loop Opto-Electronic Oscillators," Proceedings of the 2003 IEEE International Frequency Control Sympsoium and PDA Exhibition, pp. 405-410, May 2003.

Eliyahu, D., et al., "Modulation Response (S21) of the Coupled Opto-Electronic Oscillator," Proceedings of the 2005 IEEE International Frequency Control Symposium and Exposition, pp. 850-856, Aug. 2005.

Eliyahu, D., et al., "Tunable, Ultra-Low Phase Noise YIG Based Opto-Electronic Oscillator," IEEE MTT-S International Microwave Symposium Digest, 3:2185-2187, Jun. 2003.

Gorodetsky, M.L., et al., "Optical Microsphere Resonators: Optimal Coupling to High-Q Whispering-Gallery Modes," J. Opt. Soc. Am. B, 16(1):147-154, Jan. 1999.

Gorodetsky, M.L., et al., "Rayleigh Scattering in High-Q Microspheres," J. Opt. Soc. Am. B, 17(6):1051-1057, Jun. 2000.

Gorodetsky, M.L., et al., "Ultimate Q of Optical Microsphere Resonators," Optics Letters, 21(7):453-455, Apr. 1996.

Hryniewicz, J.V., et al., "Higher Order Filter Response in Coupled Microring Resonators," IEEE Photonics Technology Letters, 12(3):320-322, Mar. 2000.

Huang, S., et al., "A 'Turnkey' Optoelectronic Oscillator with Low Acceleration Sensitivity," 2000 IEEE/EIA International Frequency Control Symposium and Exhibition, pp. 269-279, Jun. 2000.

Ilchenko V. et al., "Electrooptically Tunable Photonic Microresonators and Photonic Bandgap Waveguide Coupling for Micro-Optoelectronic Oscillators," GOMACTech 2003, Tampa, Florida, pp. 1-4, 2003.

Ilchenko, V., et al., "High-Q Microsphere Cavity for Laser Stabilization and Optoelectronic Microwave Oscillator," Proceedings SPIE Microresonators and Whispering-Gallery Modes, vol. 3611, pp. 190-198, Jan. 1999.

Ilchenko, V., et al., "Microsphere Integration in Active and Passive Photonics Devices," Proc. of SPIE Laser Resonators III, vol. 3930, pp. 154-162, Jan. 2000.

Ilchenko, V., et al., "Microtorus: A High-Finesse Microcavity with Whispering-Gallery Modes," Optics Letters, 26 (5):256-258, Mar. 2001.

(56) References Cited

OTHER PUBLICATIONS

Ilchenko, V., et al., "Pigtailing the High-Q Microsphere Cavity: A Simple Fiber Coupler for Optical Whispering-Gallery Modes," Optics Letters, 24(11):723-725, Jun. 1999.

Ilchenko, V., et al., "Tunability and Synthetic Lineshapes in High-Q Optical Whispering Gallery Modes," Proc. of SPIE Laser Resonators and Beam Control VI, vol. 4969, pp. 195-206, Jan. 2003.

Ilchenko, V., et al., "Whispering-Gallery-Mode Electro-Optic Modulator and Photonic Microwave Receiver," J. Opt. Soc. Am. B, 20(2):333-342, Feb. 2003.

Ilchenko, V., et al., "Sub-Micro Watt Photonic Microwave Receiver," IEEE Photonics Technology Letters, 14 (11):1602-1604, Nov. 2002.

Ito, H., et al., "InP/InGaAs Uni-Travelling-Carrier Photodiode with 310 GHz Bandwidth," Electronics Letters, 36 (21):1809-1810, Oct. 2000.

Logan, R., et al., "Stabilization of Oscillator Phase Using a Fiber-Optic Delay-Line," IEEE 45th Annual Symposium on Frequency Control, pp. 508-512, May 1991.

Maleki, L., "The Opto-Electronic Oscillator: Prospects for Extending the State of the Art in Reference Frequency Generation," International Topical Meeting on Microwave Photonics, pp. 195-198, Oct. 1998.

Matsko, A., et al., "Active Mode Locking with Whispering-Gallery Modes," J. Opt. Soc. Am. B, 20(11):2292-2296, Nov. 2003.

Matsko, A., et al., "Whispering-Gallery-Mode based Optoelectronic Microwave Oscillator," Journal of Modern Optics, 50(15-17):2523-2542, Feb. 2004.

Matsko, A., et al., "Whispering-Gallery-Mode Resonators as Frequency References. I. Fundamental Limitations," J. Opt. Soc. Am. B, 24(6):1324-1335, Jun. 2007.

Myers, L.E., et al., "Quasi-Phase-Matched Optical Parametric Oscillators in Bulk Periodically Poled LiNbO3," J. Opt. Soc. Am. B, 12(11):2102-2116, Nov. 1995.

Savchenkov, A., et al., "Whispering-Gallery-Mode Resonators as Frequency References. II. Stabilization," J. Opt. Soc. Am. B, 24(12): 2988-2997, Dec. 2007.

Vassiliev, V.V., et al., "Narrow-Line-Width Diode Laser with a High-Q Microsphere Resonator," Optics Communications, 158(1-6):305-312, Dec. 1998.

Yao, X.S., et al., "A Novel Photonic Oscillator," Digest of the LEOS Summer Topical Meetings, pp. 17-18, Aug. 1995.

Yao, X.S., et al., "A Novel Photonic Oscillator," TDA Progress Report 42-122, pp. 32-43, Aug. 1995.

Yao, X.S., et al., "Converting Light into Spectrally Pure Microwave Oscillation," Optics Letters, 21(7):483-485, Apr. 1996.

Yao, X.S. et al., "Coupled Optoelectronic Oscillators for Generating Both RF Signal and Optical Pulses," Journal of Lightwave Tecnhology, 18(1):73-78, Jan. 2000.

Yao, X.S., et al., "Dual Microwave and Optical Oscillator," Optics Letters, 22(24):1867-1869, Dec. 1997.

Yao, X.S., et al., "Multiloop Optoelectronic Oscillator," IEEE Journal of Quantum Electronics, 36(1):79-84, Jan. 2000.

Yao, X.S., et al., "Optoelectronic Microwave Oscillator," J. Opt. Soc. Am. B, 13(8):1725-1735, Aug. 1996.

Yao, X.S., et al., "Optoelectronic Oscillator for Photonic Systems," IEEE Journal of Quantum Electronics, 32 (7):1141-1149, Jul. 1996.

Yu, J., et al., "Compact Optoelectronic Oscillator with Ultra-Low Phase Noise Performance," Electronics Letters, 35 (18):1554-1555, Sep. 1999.

International Search Report and Written Opinion dated May 21, 2009 for International Application No. PCT/US2008/012815, filed Nov. 13, 2008 (7 pages).

Hossein-Zadeh, M., et al., Electro-optic bistability in a LiNbO3 microdisk resonator, IET Optoelectronics, vol. 2, No. 3, pp. 111-114, Jun. 2008.

Ilchenko, V., et al., "Whispering-gallery mode based photonic RF receiver," 2010 IEEE/MTT-S International Microwave Symposium, pp. 744-747, 2010.

Ivanov, E.N., "Noise Properties of Microwave Signals Synthesized with Femtosecond Lasers," 2005 IEEE, School of Physics, University of Western Australia, 35 Stirling Hwy, Crawley, 6009, Time and Frequency Division, National Institute of Standards and Technology, 325 Broadway, Boulder, CO 80305, pp. 932-936, 2005.

Jie, Li, et al., "Direct Generation of Subpicosecond Chirp-Free Pulses at 10 GHz from a Nonpolarization Maintaining Actively Mode-Locked Fiber Ring Laser," IEEE Photonics Technology Letters, IEEE Service Center, Piscataway, NJ, US, vol. 12, No. 9, Sep. 1, 2000.

Savchenkov, A., et al., "RF photonic signal processing components: From high order tunable filters to high stability tunable oscillators," IEEE Radar Conference, pp. 1-6, May 2009.

Savchenkov, A., et al., "Tunable optical single-sideband modulator with complete sideband suppression," Optics Letters, vol. 34, No. 9, pp. 1300-1302, May 2009.

Savchenkov, A., et al., "Tunable Resonant Single-Sideband Electro-Optical Modulator," Digest of the IEEE/LEOS Summer Topical Meetings, pp. 63-64, Jul. 2009.

Yoshida, E., et al., "Intracavity Dispersion Effects of a Regeneratively and Harmonically FM Mode-Locked Erbium-Doped Fiber Laser," IEICE Transactions on Electronics, Electronics Society, Tokyo, JP vol. E81-C, No. 2, pp. 189-194, Feb. 1998.

Jin, C.-Y., "Numerical and Theoretical Analysis of the Crosstalk in Linear Optical Amplifiers," IEEE Journal of Quantum Electronics, vol. 4(5):636-641, May 2005.

\* cited by examiner

MEASURING PHASE NOISE IN RADIO FREQUENCY, MICROWAVE OR MILLIMETER SIGNALS BASED ON PHOTONIC DELAY

CROSS-REFERENCES TO RELATED APPLICATIONS

This application is a divisional application of U.S. patent application Ser. No. 12/889,398 filed Sep. 23, 2010, which claims the benefit of the filing dates of U.S. Provisional Application No. 61/244,959 filed Sep. 23, 2009 and U.S. Provisional Application No. 61/333,665 filed May 11, 2010.

U.S. patent application Ser. No. 12/889,398 application is also a continuation-in-part of U.S. patent application Ser. No. 12/270,845 filed Nov. 13, 2008, which claims the benefit of the filing date of U.S. Provisional Application No. 61/002,918 filed Nov. 13, 2007.

The entire contents of the before-mentioned patent applications are incorporated by reference as part of the disclosure of this application.

BACKGROUND

This document relates to techniques and devices for measuring phase noise in radio frequency (RF), microwave, or millimeter signals.

RF, microwave or millimeter signals can be generated by oscillators operating in the respective spectral ranges. The output of an oscillator may be used in communications and other applications. The oscillation frequency of an oscillator can be used as a frequency reference where it is desirable that the noise of the oscillator be low and can be properly measured. A measurement apparatus for characterizing an oscillator should have low noise.

SUMMARY

This document describes techniques and devices for measuring phase noise in radio frequency (RF), microwave, or millimeter signals based on photonic delay.

In one aspect, a device for measuring a phase noise in a signal is provided to include an input port that receives an oscillation signal from an oscillator under test; a first photonic signal processing branch circuit that processes the oscillation signal to produce a first branch output signal; and a second photonic signal processing branch circuit that processes the oscillation signal to produce a second branch output signal. The first and second photonic signal processing branch circuits share a common optical module that includes a shared laser producing continuous wave laser light at first and second wavelengths, a shared optical modulator that modulates the laser light at the first and second wavelengths to produce modulated laser light that carries the oscillation signal, a shared optical delay that receives the modulated laser light from the shared optical modulator and a wavelength-selective optical device that separates the modulated laser light output by the shared optical delay into a first modulated laser beam at the first wavelength that is processed by the first photonic signal processing branch circuit to produce the first branch output signal and a second modulated laser beam at the second wavelength that is processed by the second photonic signal processing branch circuit to produce the second branch output signal. The device includes circuitry that receives the first and second branch output signals to measure noise in the received oscillation signal and controls the first and second photonic signal processing branch circuits and measurements of the noise in the received oscillation signal.

In another aspect, a device for measuring a phase noise in a signal is provided to include an input port that receives an oscillation signal from an oscillator under test; a photonic signal processing circuit that processes the oscillation signal to produce an output signal; and circuitry that receives and processes the output signal to measure noise in the received oscillation signal and controls the photonic signal processing circuit and measurements of the noise in the received oscillation signal. The photonic signal processing circuit includes a laser producing continuous wave laser light in a first optical polarization, an optical modulator that modulates the laser light to produce modulated laser light that carries the oscillation signal and is in the first optical polarization, a photonic beam combiner that receives at a first port the modulated laser light in the first optical polarization along a first optical path from the optical modulator, directs the received modulated laser light in the first optical polarization to a second port and directs light received at the second port in a second optical polarization orthogonal to the first optical polarization to a third port, a fiber delay line coupled to the second port to receive light from the photonic beam combiner, a Faraday rotator mirror coupled to the fiber delay line to reflect light back to the fiber delay line by rotating optical polarization by 90 degrees, a photodetector coupled to receive light from the third port of the photonic beam combiner to generate a detector signal, a voltage controlled phase shifter that receives a copy of the oscillation signal and changes a phase of the copy of the oscillator signal to produce a phase-shifted oscillator signal, and a signal mixer that mixes the detector signal and the phase-shifted oscillator signal to produce the output signal.

In another aspect, a device for measuring a phase noise in a signal is provided to include an input port that receives an oscillation signal from an oscillator under test; a first laser producing a first continuous wave laser beam in a first optical polarization; a first optical modulator that modulates the first laser beam to produce a first modulated laser light that carries the oscillation signal; a first optical circulator having a first port that receives the first modulated laser light in the first optical polarization and a second port that outputs light from the first port and a third port that outputs light received at the second port; a second laser producing a second continuous wave laser beam in a second optical polarization orthogonal to the first optical polarization; a second optical modulator that modulates the second laser beam to produce a second modulated laser light that carries the oscillation signal; and a second optical circulator having a first port that receives the second modulated laser light in the second optical polarization and a second port that outputs light from the first port and a third port that outputs light received at the second port. This device includes photonic beam combiner that includes a first port, a second port and a third port. The first port is coupled to the second port of the first optical circulator to receive the first modulated laser light in the first optical polarization which is directed to the second port of the photonic beam combiner. The photonic beam combiner directs light received at the second port in the second optical polarization to the third port and directs light received at the second port in the second optical polarization to the first port, and the third port of the photonic beam combiner is coupled to receive light of the second modulated laser beam in the second polarization from the second port of the second optical circulator. This device includes a fiber delay line coupled to the second port of the photonic beam combiner to receive light from the photonic beam combiner to introduce a phase delay in both the first and second modulated laser beams; a Faraday rotator mirror coupled to the fiber delay line to reflect light back to the fiber delay line by rotating optical polarization by 90 degrees; a first photodetector coupled to receive light from the third port of the second optical circulator to generate a first detector signal; a second photodetector coupled to receive light from the third port of the first optical circulator to generate a second detector signal; a first voltage controlled phase shifter that receives a copy of the oscillation signal and changes a phase of the copy of the oscillator signal to produce a first phase-shifted oscillator signal; a first signal mixer that mixes the first detector signal and the first phase-shifted oscillator signal to produce a first output signal; a second voltage controlled phase shifter that receives another copy of the oscillation signal and changes a phase of the other copy of the oscillator signal to produce a second phase-shifted oscillator signal; and a second signal mixer that mixes the second detector signal and the second phase-shifted oscillator signal to produce a second output signal. This device also includes circuitry that receives the first and second output signals to measure noise in the received oscillation signal, and controls the first and second voltage controlled phase shifters and measurements of the noise in the received oscillation signal.

In yet another aspect, this document provides an implementation of a system for characterizing an oscillator. This system includes an input port that receives an oscillation signal from an oscillator under test; an input port signal splitter that splits the received oscillation signal into a first oscillation signal and a second oscillation signal; a first photonic signal processing branch circuit that processes the first oscillation signal to produce a first branch output signal; a second photonic signal processing branch circuit that processes the second oscillation signal to produce a second branch output signal; a dual channel signal analyzer that receives the first and second branch output signals to measure noise in the received oscillation signal; and a computer controller that controls the first and second photonic signal processing branch circuits and the dual channel signal analyzer to control measurements of the noise in the received oscillation signal.

In one implementation of the above system, the first photonic signal processing branch circuit includes a first signal splitter to splits the first oscillation signal into a first branch signal and a second branch signal; a photonic branch that receives the first branch signal and comprises a laser that produces a laser beam, an optical modulator that modulates the laser beam in response to the first branch signal to produce a modulated laser beam that carries the first branch signal, an optical delay unit that transmits the modulated laser beam to produce a delay in the modulated laser beam, and an optical detector that converts the modulated laser beam into a detector signal; an electrical branch that receives the second branch signal and comprises a voltage controlled phase shifter that receives the second branch signal and to changes a phase of the second branch signal to produce an output signal; and a signal mixer that mixes the detector signal and the output signal to produce the first branch output signal.

These and other aspects and associated features and their implementations are described in greater detail in the drawings, the description and the claims.

DETAILED DESCRIPTION

This application describes techniques, devices and systems for measuring phase noise in RF, microwave, or millimeter signals and for characterizing oscillators in RF, microwave, or millimeter spectral range based on photonic components.

Figure 1:
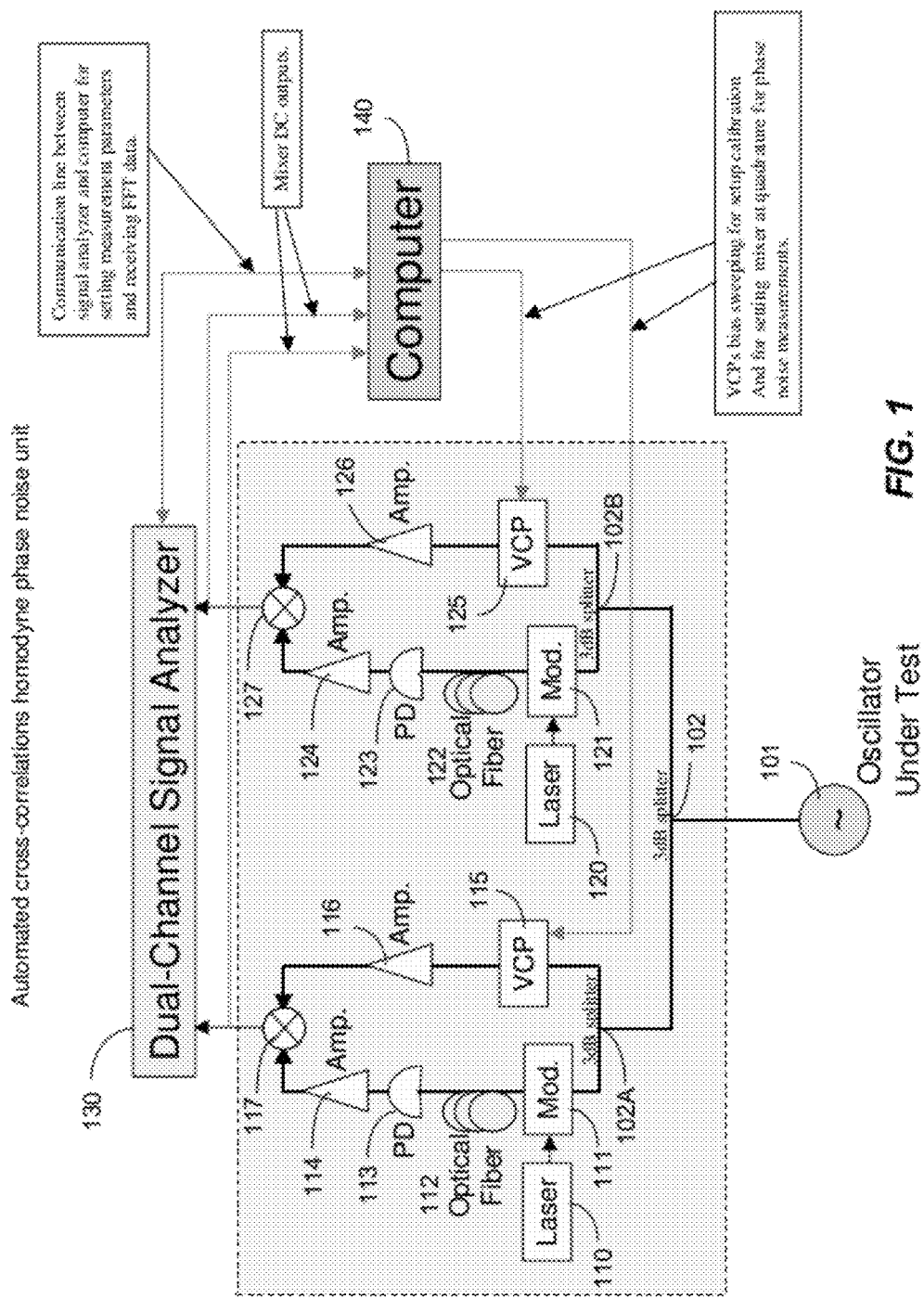
FIG. 1 shows an example for an automated opto-electronics cross-correlation homodyne phase noise setup to illustrate various technical features.

FIG. 1 shows an example for a phase noise measurement device based on an automated opto-electronics cross-correlation homodyne phase noise setup to illustrate various technical features. This exemplary setup is implemented via optical fiber serving as a long delay line. The dual homodyne setup is then cross correlated at the signal analyzer to reduce the noise of each of the homodyne branches by averaging out noise that is not correlated with the oscillator under test.

Phase noise measurements of RF, microwave or millimeter oscillators generating high purity electro-magnetic signals require low phase noise measurement setup. The present technique can be used to reduce the noise floor of a single homodyne measurement setup by cross correlating the signals of two measurement setups. The uncorrelated noise from each of the two measurement setups is averaged out at the signal analyzer. The phase noise floor of the cross-correlated dual systems can be improved by 5 log(N) (in dB units), where N is the number of averages.

Each of the two measurement setups is an electro-optic homodyne setup with two signal branches. A signal splitter splits a received signal from an oscillator 101 into the two branches. The oscillator 101 under test is coupled to the input port of the system which includes an input port splitter 102. The two signal branches include two branch signal splitters 102A and 102B, respectively. Each of the splitters 102A and 102B splits the received signal into two signals for two branches.

The first signal branch is a photonic signal branch which includes a high-speed optical modulator (MOD) 111 or 121 to modulate a CW laser beam from a laser 110 or 120 in response to the microwave/RF signal to produce a modulated optical signal that carries the microwave/RF signal. The modulated optical signal is directed along an optical fiber which serves as a signal delay line 112 or 122, allowing for efficient discrimination of the noise. The increase of the length of the fiber 112 or 122 leads to an increased delay of the signal and reduces the close-in phase noise of the setup. The photodetector (PD) 113 or 123 converts the modulated light back into a microwave or RF signal which is then amplified by an amplifier 114 or 124. The second signal branch includes a voltage controlled phase shifter (VCP) 115 or 125 and a signal amplifier 116 or 126. A signal mixer 117 or 127 is used to combine the two branches together to mix the signals from the two branches to produce a beat signal. The VCP 115 or 125 controls the phase delay of the signal in the second branch to produce a desired relative phase between the signals of the two branches at the signal mixer 117 or 127, e.g., a 90 degree phase shift between the two signals known as the quadrature setting for the signal mixer 117 or 127 where the phase noise is represented by the DC voltage in the beat signal. A dual channel signal analyzer 130 is provided to receive the beat signals from the two measurement setups and to produce Fast Fourier Transform (FFT) on the beat signals as FFT data. The cross correlation of the signals of two measurement setups effectively suppresses uncorrelated noise from each of the two measurement setups without using a reference oscillator or a phase locking loop and provides a low noise measurement system for measuring phase noise in an oscillator.

The optical delay line 112 or 122 provides a desired long optical delay that is sufficiently large to reduce the noise floor of the device under a desired level. Different from a coaxial RF delay line which tends to suffer from significant signal loss as the length of the delay increases, the optical delay line can provide a long delay with relatively small loss of light. Therefore, long optical delays, e.g., with fiber in the range of kilo meters, can be achieved with fiber loops. The laser 110 which produces continuous wave laser light and the optical modulator 111 collectively transform the oscillator signal from the oscillator 101 under test in the RF, microwave or millimeter domain into the optical domain and the optical delay line 112 or 122 is used to introduce the desired phase delay in the optical domain. The photodetector 113 or 123 then converts the phase delayed optical signal back to the RF, microwave or millimeter domain.

Such a system can be automated by using a voltage controlled phase shifters (VCPs) and a computer controller 140. The VCPs 115 and 125 are used for the calibration (voltage to phase) of the setup and for tuning the phase of the signal in the second branch at the mixer to bring the mixer to the quadrature setting so the mixer output would be sensitive to phase noise in the oscillator signal. The computer or microprocessor 140 is used to carry out the measurement automatically. The computer measures the calibration factor and put the mixer in quadrature. The computer 140 also controls the signal analyzer parameters, such as frequencies, the number of averages, the resolution, the bandwidth etc. In addition, the computer 140 can be used to generate plots of the phase noise at the monitor and allows for saving the data.

In various implementations, the functions of the signal analyzer 130 and functions of the computer controller 140 may be grouped or separated in various configurations. In some implementations, a signal processing and control circuitry module may be implemented to provide the functions of the signal analyzer 130 and computer controller 140 as illustrated and described herein. This circuitry module may be implemented without having the same partition of functions as the signal analyzer 130 and computer controller 140. For example, if an analog-to-digital converter (ADC) is used instead of the signal analyzer 130 to receive the outputs from the mixers 117 and 127, the computer controller 140 can be used to collect the digitized data from the ADC and calculate the FFT based on the received data.

Following is a tuning and calibration procedure for the cross-correlation homodyne phase noise set-up in FIG. 1. The computer can be operated to perform this procedure automatically. The procedure includes calibration, quadrature setting and phase noise measurements.

1. Calibration

In the calibration process, the computer 140 is used to send control signals to the VCPs 115 and 125 to sweep the bias voltages over the VCPs 115 and 125. At the same time, the computer 140 is in communication with each of the mixers 117 and 127 to record the mixer output voltage responses through an analog-to-digital (A/D) conversion card.

Next, the computer 140 use stored calibration formulas for the voltage controlled phase shifters as a function of the VCP's bias voltage, $\phi(V_{VCP})$, to calculate the calibration responses for various VCP phases to the mixer voltage ($\Delta\phi/\Delta V_{mixer}$ at $V_{mixer}=0$), for each of the two measurement setups. This completes the calibration process.

2. Quadrature Setting

Based on the calibration data, the computer 140 tunes the bias voltage of each VCP to shift the phase so that each mixer is at the zero DC output. This sets the mixers at quadrature so that the output of each mixer is sensitive to the phase noise with low sensitivity to amplitude noise at saturation.

3. Phase Noise Measurements

To measure phase noise of an input oscillation signal in FIG. 1, the computer 140 controls the signal analyzer 130 to set various operating parameters, including the range of measurement frequencies, the resolution bandwidth, the number of averages and other parameters. A user can control these parameters through the user interface software. After the operating parameters of the signal analyzer 130 are set, the input signal is directed into the input port splitter 102 and data acquisition is performed by using the computer 140 to retrieve output voltage fluctuations produced by the two mixers 117 and 127 and the FFT data from the signal analyzer 130.

During the data acquisition, the computer 140 monitors the output voltage fluctuations produced by the two mixers 117 and 127. If the output voltage from a mixer drifts over an allowable range due to the oscillator frequency drift and/or the delay thermal drift, the computer 140 sets the signal analyzer 130 on a pause mode to suspend the data acquisition. Next, the computer 140 controls the VCPs 115 and 125 to bring the system to the quadrature setting again, and resumes the FFT measurements.

The FFT data retrieved by the computer 140 is then converted to a phase noise spectral density using the calibration value measured during the calibration and the fiber delay length factor. The data can be plotted on the screen of the computer 140, and optionally could be stored into a file.

The noise floor of the system could be improved by increasing N, the number of FFT averages. The noise floor drops as 5 log(N) (in dB units).

The above procedure describes only one of software modes of operation of the device in FIG. 1. Other modes for operating the device in FIG. 1 includes using only one of the two homodyne setups, or measuring the mixer voltage spectral density directly (for active/passive device phase noise measurements). The device in FIG. 1 can be designed to allow a user to control the delay length of the fiber delay line 112.

The phase noise measuring device in FIG. 1 has the advantage of direct phase noise measurements without relying on a second oscillator and phase locking. The RF carrier frequency range in such a device can be wide and may be limited by the RF amplifiers and VCPs. Some implementations of the device in FIG. 1 can be used for RF carrier frequencies between 6 to 12 GHz with a noise floor better than −110 dBc/Hz at a frequency offset of 100 Hz, −140 dBc/Hz at a frequency offset of 1 kHz and −170 dBc/Hz for frequency offsets greater than 10 kHz.

Figure 2:
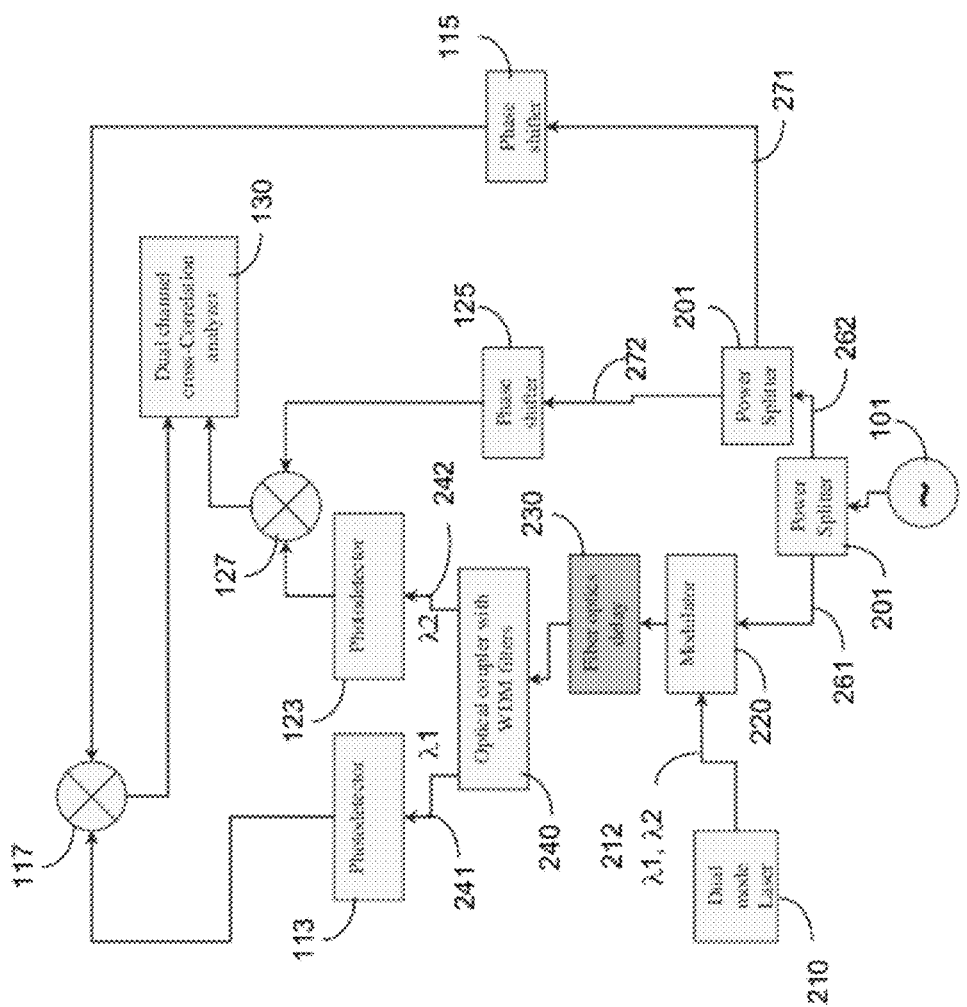
FIGS. 2, 3 and 4 show examples of cross-correlation phase noise measurement devices based on a shared optical modulator and a shared laser.
Figure 3:
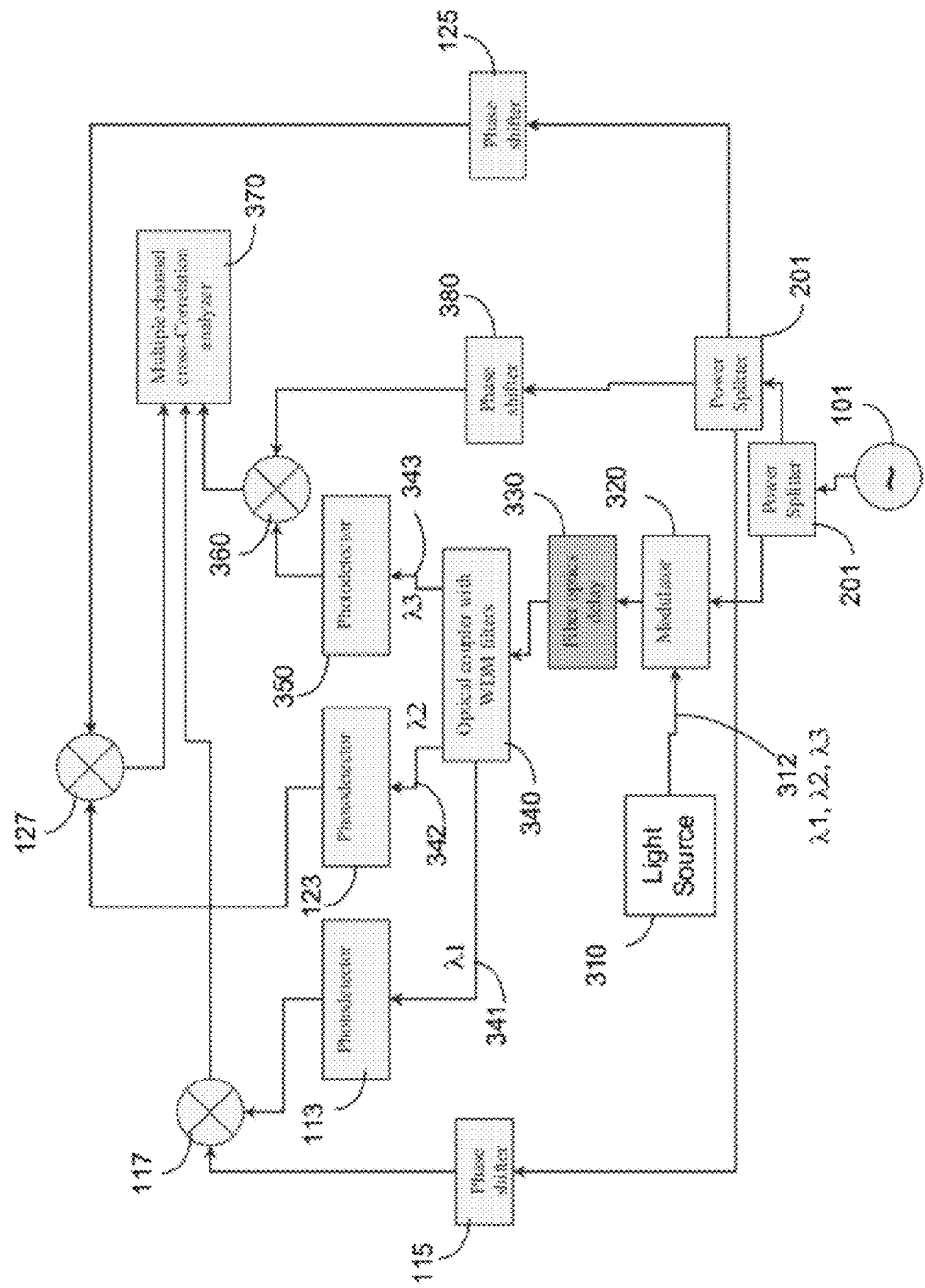
Figure 4:
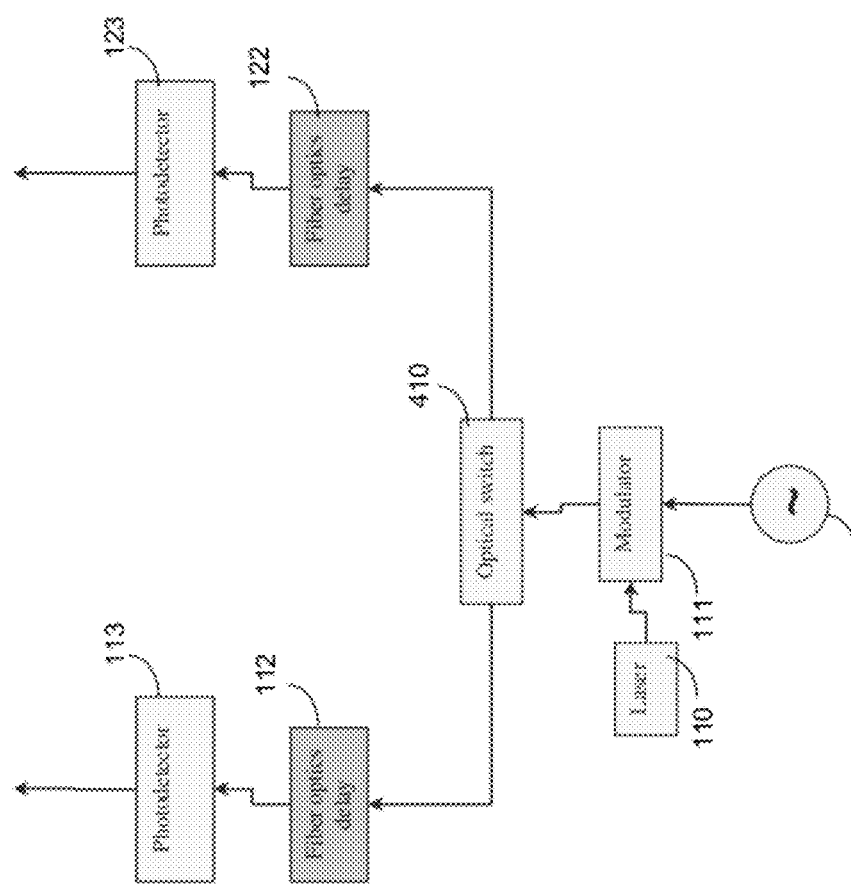

In the phase noise measurement device in FIG. 1 based on cross correlation between the two measurement branches, two sets of lasers, optical modulators and fiber delay lines are used in the two measurement branches. Such lasers and optical modulators increase the device cost. The fiber delay lines tend to be bulky for some applications where each fiber delay line may have a length of several kilometers. FIGS. 2, 3 and 4 shows examples of designs that share photonic components between different measurement branches.

FIG. 2 shows an example that uses light at two different wavelengths λ1 and λ2 to go through the same optical modulator and optical fiber delay line for effectuating the two separate photonic arms in the two measurement branches in the device in FIG. 1. The design in FIG. 2 represents a microwave, RF or millimeter photonics cross-correlation phase noise measurement system that utilizes multiple delays over a single fiber. This configuration delivers multiple optical signals, each over a different optical wavelength, in a single fiber. This configuration reduces the required delay length by the number of required delays, which can significantly reduce the system size. Passive optical couplers and WDM filters are used to route the optical signals at different wavelengths. The design in FIG. 2 provides a simplified configuration for high order statistical calculations of signal moments and correlation coefficients of multiple signals over the delay time.

In FIG. 2, a power splitter 201 is used to split the input oscillator signal from the oscillator 101 under test into two oscillator signals 261 and 262. The oscillator signal 261 is directed into an optical modulator 220 and the oscillator signal 262 is further split into oscillator signals 271 and 272.

A light source 210 is provided to produce continuous wave laser light at two different wavelengths λ1 and λ2. The light source 210 can be implemented in various configurations, e.g., a dual mode laser that produces the laser light 212 wavelengths λ1 and λ2 or a light source that includes two lasers respectively producing two laser beams at wavelengths λ1 and λ2. The CW light at the wavelengths λ1 and λ2 is directed into an optical modulator 220 that receives the oscillator signal 261 from the power splitter 201 and modulates the received light to produce modulated light at wavelengths λ1 and λ2 carrying the oscillator signal 261. The modulated light at wavelengths λ1 and λ2 carrying the oscillator signal 261 is coupled into a single fiber delay line 230. The output light from the single fiber delay line 230 is directed into a wavelength-selective optical device 240 that splits the light into a first optical beam 241 at the wavelength λ1 and a second optical beam 242 at the wavelength λ2, both carrying the oscillator signal 261 with the delay caused by transmitting through the fiber delay line 230. The optical device 240 can be implemented in various configurations. For example, the optical device 240 can be an optical coupler with two wavelength-division multiplexing (WDM) filters where the light is split into two portions to the two WDM filters. The first WDM filter selectively outputs light at the wavelength λ1 while rejecting light at the wavelength λ2, and the second WDM filter selectively outputs light at the wavelength λ2 while rejecting light at the wavelength λ1. In another example, a single add-drop optical filter can be used as the optical device 240 to selectively separate light at the two wavelengths into two output beams 241 and 242 which can be coupled to separate fibers. The two output beams 241 and 242 are then respectively directed to two photodetectors 113 and 122 which convert the received light back to the RF, microwave or millimeter domain. The detector output signals from the photodetectors 113 and 123 in FIG. 2 function as equivalents of the two detectors output signals from the photodetectors 113 and 123 of the two photonic signal paths of the two measurement branches in FIG. 1.

The oscillator signal 271 is directed to the VCP 115 which adjusts the phase of the signal 271 in response to a control signal from the computer 140 in FIG. 1. Similarly, the oscillator signal 272 is directed to the VCP 125 which adjusts the phase of the signal 272 in response to another control signal from the computer 140 in FIG. 1. The output signal from the VCP 115 is then mixed with the detector output signal from the photodetector 113 at the mixer 117 and the output signal from the VCP 125 is then mixed with the detector output signal from the photodetector 123 at the mixer 127. The output signals from the mixers 117 and 127 are then directed into the signal analyzer 130.

Therefore, the optical modulator 220, the single fiber delay line 230, the optical device 240, the photodetector 113 in FIG. 2 form an equivalent of the photonic arm formed by the optical modulator 111, the optical fiber delay line 112, and the photodetector 113 for the first measurement branch in FIG. 1. The power splitter 201 and the VCP 115 in FIG. 2 form an equivalent of the other arm formed by the splitter 102A and the VCP 115 for the first measurement branch in FIG. 1. Similarly, the optical modulator 220, the single fiber delay line 230, the optical device 240, the photodetector 123 in FIG. 2 form an equivalent of the photonic arm formed by the optical modulator 121, the optical fiber delay line 122, and the photodetector 123 for the second measurement branch in FIG. 1. The power splitter 201 and the VCP 125 in FIG. 2 form an equivalent of the other arm formed by the splitter 102B and the VCP 125 for the second measurement branch in FIG. 1.

The design in FIG. 2 can be extended to a device with three or more measurement branches. FIG. 3 shows another example with three measurement branches that share a common optical modulator 320, and a common fiber delay line 330. A light source 310 is provided to produce continuous wave laser light 312 at three different wavelengths λ1, λ2 and λ3. An optical device 340 is used to split the received light into three beams 341, 342 and 343 at wavelengths λ1, λ2 and λ3, respectively. A third photodetector 350, a third VCP 380 and a third mixer 360 are provided to form part of the third measurement branch that is operated based on the light at wavelength λ3.

FIG. 4 shows another example where an optical switch or splitter 410 is provided allow different measurement branches to share the same laser 110 and same optical modulator 111 without using separate lasers and separate optical modulators as in the device in FIG. 1. The modulated light output by the shared optical modulator 111 is directed two different fiber delay lines for two different measurement branches.

The above phase noise measurements measure phase noise through the use of delay lines. Microwave photonics optical links can provide long delays by carrying the oscillator signal on an optical carrier over compact, low loss, and long fibers. Reduction of the system noise floor is achievable with the help of cross correlation analysis via uncorrelated delays. Also, removing system artificial spurs associated with the use of long fiber delays may require multiple optical fiber delay lines such as shown in the device in FIG. 1. The designs in FIGS. 2 and 3 provide shared configurations where photonic parts of the device are shared by different measurement branches for the cross correlation, thus reducing the required total fiber length segments with a single fiber. The single optical fiber shared by different measurement branches is used to carry multiple microwave signals over different optical carrier wavelengths. Each of the signals is then extracted to be fed in separate photodetectors for analysis. For example, dual delay line cross correlation setup could use a single fiber with a single coupler and two WDM filters at the fiber end. Each signal is then down converted with the help of a photodetector and a mixer. The two down converted signals are then analyzed for cross-correlation (noise floor reduction) via a dual channel signal analyzer.

Another example is the need for multiple fiber lengths for the elimination of artificial spurs due to the fiber delay. This could be achieved by having a few optical wavelengths carrying the same RF/microwave signals over a single optical fiber. Each of the wavelengths is then coupled to a photodetector (after passing through the appropriate the fiber length/ delay) via an optical coupler and a WDM filter.

The above described techniques that use three or more measurement branches shown in FIG. 3 can be used for complex analysis of signals, such as measurements of statistical moments and higher order correlation coefficients. For example, a multi-channel signal analyzer that receives signals from three or more measurement branches can be used to measure high order average values and correlations and, therefore, provide better insight of the statistical distribution function of the statistical parameter under test.

As discussed above, the long fiber delay line allows for reduced floor noise in phase noise measurements based on the delay discriminator designs presented in this document. In various implementations, each long fiber delay line may be of several kilometers and thus can be bulky and occupy significant space in the device. Various applications prefer compact devices and it is desirable to reduce the actual lengths of the fiber delay lines while still maintaining the desired long delays achieved through the fiber delay lines. One example is to use optical polarization property of light to direct light to pass through a fiber delay line twice to cut the needed fiber length by one half. Several examples for such a design are provided below.

Figure 5:
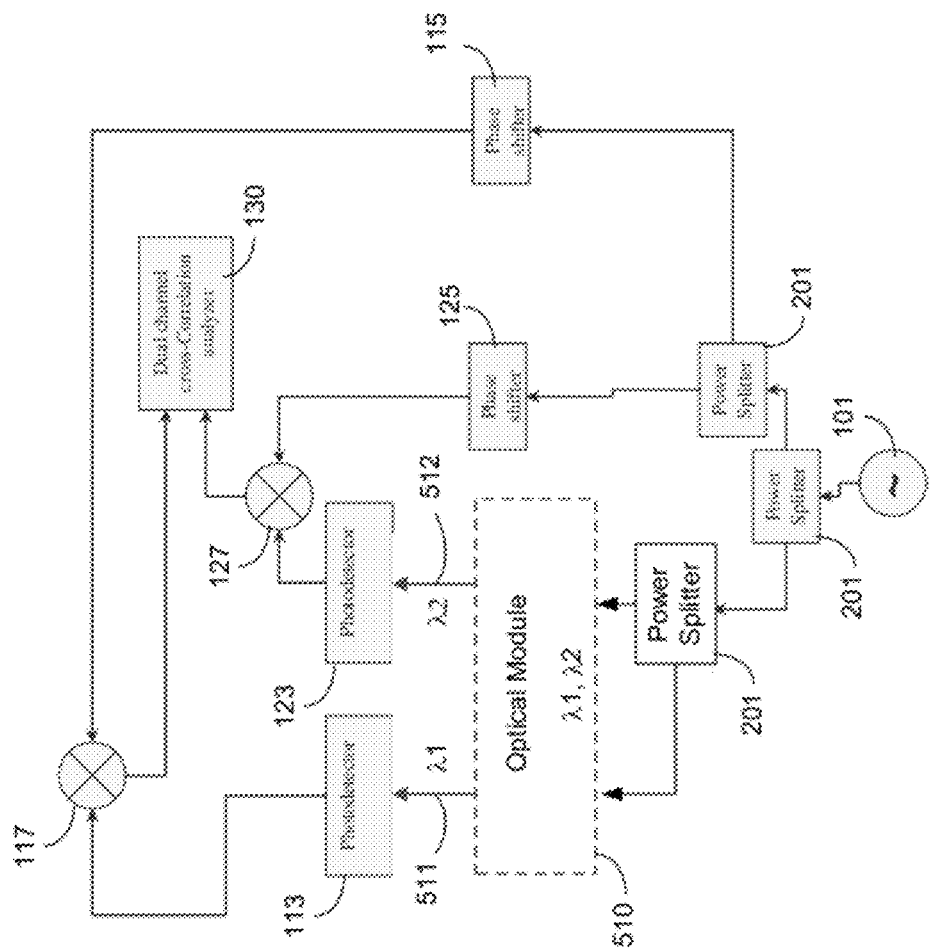
FIGS. 5, 6A, 6B, 7 and 8 show examples of phase noise measurement devices that use optical polarization of light and Faraday rotator mirrors to reduce the physical lengths of fiber delay lines.

FIG. 5 shows an example of a dual channel cross correlation phase noise measurement device having two measurement branches based on an optical module 510 that uses two orthogonal optical polarizations and Faraday reflectors to direct light through a fiber delay line twice. The two measurement branches in FIG. 5 are similarly structured as the design in FIG. 2 but the photonic delay line designs in FIGS. 5 and 2 are different. In FIG. 5, the polarization-based optical module 510 is provided to apply the oscillator signal from the power splitter 201 that is originated by the oscillator 101 to modulate laser light in two orthogonal polarizations to produce two modulated optical beams 511 and 512 that carry the oscillator signal and undergo optical phase delays. The modulated optical beams 511 and 512 are directed into the two photodetectors 113 and 123, respectively. The two modulated optical beams 511 and 512 can be of the same wavelength or two different wavelengths as marked in FIG. 5 as long as the two beams are orthogonal in their polarizations for separating the two beams using a polarization-based photonic beam combiner (PBC) that combines and separates light of the two mutually orthogonal polarizations. Three power splitters 201 are used to split the oscillator signal from the oscillator 101 into four copies of the oscillator signal for the four signal arms in the two measurement branches.

Figure 6:
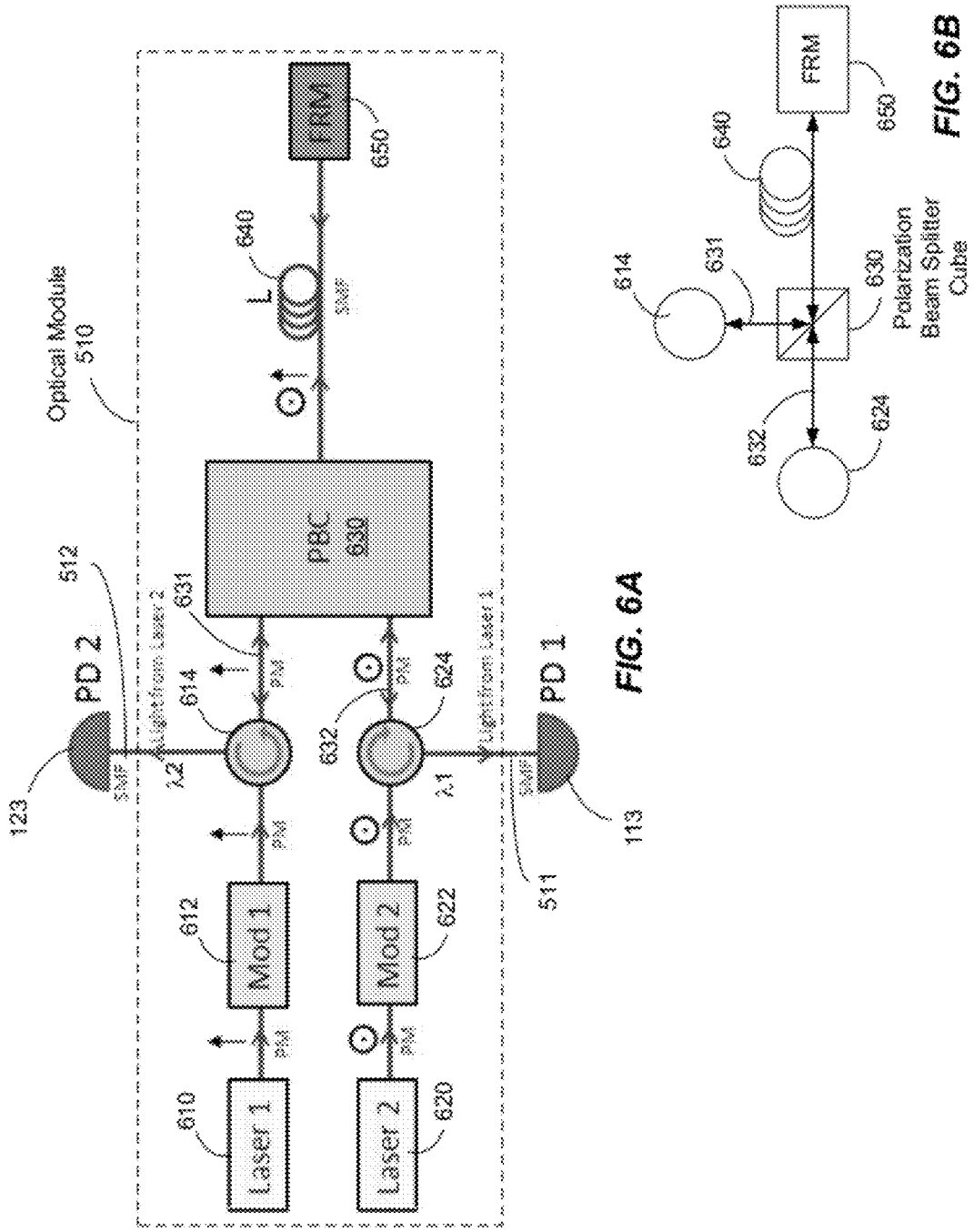

FIG. 6A shows one exemplary implementation of the polarization-based optical module 510 in FIG. 5. Two lasers 610 and 620 are provided to produce two laser beams that are respectively directed into two optical modulators 612 and 622 in mutually orthogonal polarizations. Polarization maintaining (PM) fibers can be used to guide the two laser beams from the lasers 610 and 620 in two orthogonal linear polarizations to the two optical modulators 612 and 622 and PM fibers are also used at other locations where their mutually orthogonal polarizations are maintained. The two optical modulators 612 and 622 are coupled to receive two copies of the oscillator signal and modulate the oscillator signal onto the two optical beams from the lasers 610 and 620, respectively. The modulated optical beams output by the two optical modulators 612 and 622 are maintained at mutually orthogonal polarizations and are directed to two optical circulators 614 and 624, respectively. The optical circulators 614 and 624 are optically coupled to photodetectors 123 and 113 and a polarization-based photonic beam combiner (PBC) 630 as shown. More specifically, the optical circulator 614 is coupled to receive the modulated optical beam from the first optical modulator 612 and to direct the light to the PBC 630 along the optical path 631 (e.g., PM fiber) and to direct light from the PBC 630 along the path 631 to the second photodetector 123; and the optical circulator 624 is coupled to receive the modulated optical beam from the second optical modulator 622 and to direct the light to the PBC 630 along the optical path 632 (e.g., PM fiber) and to direct light from the PBC 630 along the path 632 to the first photodetector 113.

The PBC 630 is designed to combine the two orthogonally polarized beams received from the optical paths 631 and 632 into a combined beam and couples the combined beam into a fiber delay line 640, e.g., a single mode fiber (SFM) delay line. The fiber delay line 640 is terminated at a Faraday rotator mirror (FRM) 650 which reflects light back to the fiber delay line 640 to return to the PBC 630. The FRM 650 includes a Faraday rotator that rotates light polarization by 45 degrees in a single path and a reflector that reflects light that transmits through the Faraday rotator back to transmit the Faraday rotator for the second time. Therefore, the polarization of the returned light from the FRM 650 is rotated 90 degrees. The two light beams that enter the PBC 630 via the two optical paths 631 and 632 remain orthogonal in polarization when they are reflected back to the PBC 630 by the FRM 650 but their polarizations are switched. As a result, the PBC 630 is designed to separate the returned beams by their polarizations so that the returned light in the same polarization as the polarization in the optical path 631 is directed by the PBC 630 to the optical path 631 and the returned light in the same polarization as the polarization in the optical path 632 is directed by the PBC 630 to the optical path 632. Therefore, the light that enters the PBC 630 via the optical path 631 is, after reflection by the FRM 650, directed by the PBC 630 along the optical path 632 to the optical circulator 624 which, in turn, directs the light to the first photodetector 113; and the light that enters the PBC 630 via the optical path 632 is, after reflection by the FRM 650, directed by the PBC 630 along the optical path 631 to the optical circulator 614 which, in turn, directs the light to the second photodetector 123.

FIG. 6B shows one example for implementing the PBC 630 by using a polarization beam splitting cube which reflects light in the first polarization in the optical path 631 and transmits light in the second polarization in the optical path 632.

Therefore, the above use of the optical circulators 614 and 624, the PBC 630 and the FRM 650 allows the two signals from the two lasers 610 and 620 to be combined into a single low cost single mode fiber 640 having orthogonal polarizations. After traveling for one half of the required fiber length in a single channel, the light in the fiber 640 is reflected back using the FRM 650 which also rotates each of the polarizations by 90 degrees. This compensates for any polarization rotation along the fiber 640 and brings the signals back to the PBC 630 with the original polarization states rotated by 90 degrees. The PBC 630 then splits the two orthogonally polarized signals into the two separate fibers 631 and 632. The circulators 614 and 624 can be PM circulators that allow coupling of these delayed signals into separate photodetectors 113 (PD1) and 1234 (PD2). Each signal is then down converted with the help of a respective PD 113 or 123 and a respective mixer 117 or 127 (FIG. 5). The two down converted signals are then analyzed for cross-correlation (noise floor reduction) via the dual channel signal analyzer 130.

Under the designs in FIGS. 5, 6A and 6B, the two separate signals propagate twice within the fiber delay line 640 and the fiber length needed for the desired delay is reduced to a quarter of the fiber delay length that is otherwise needed for the two channels based on the design of a cross-correlation configuration of two separate fibers in FIG. 1.

Figure 7:
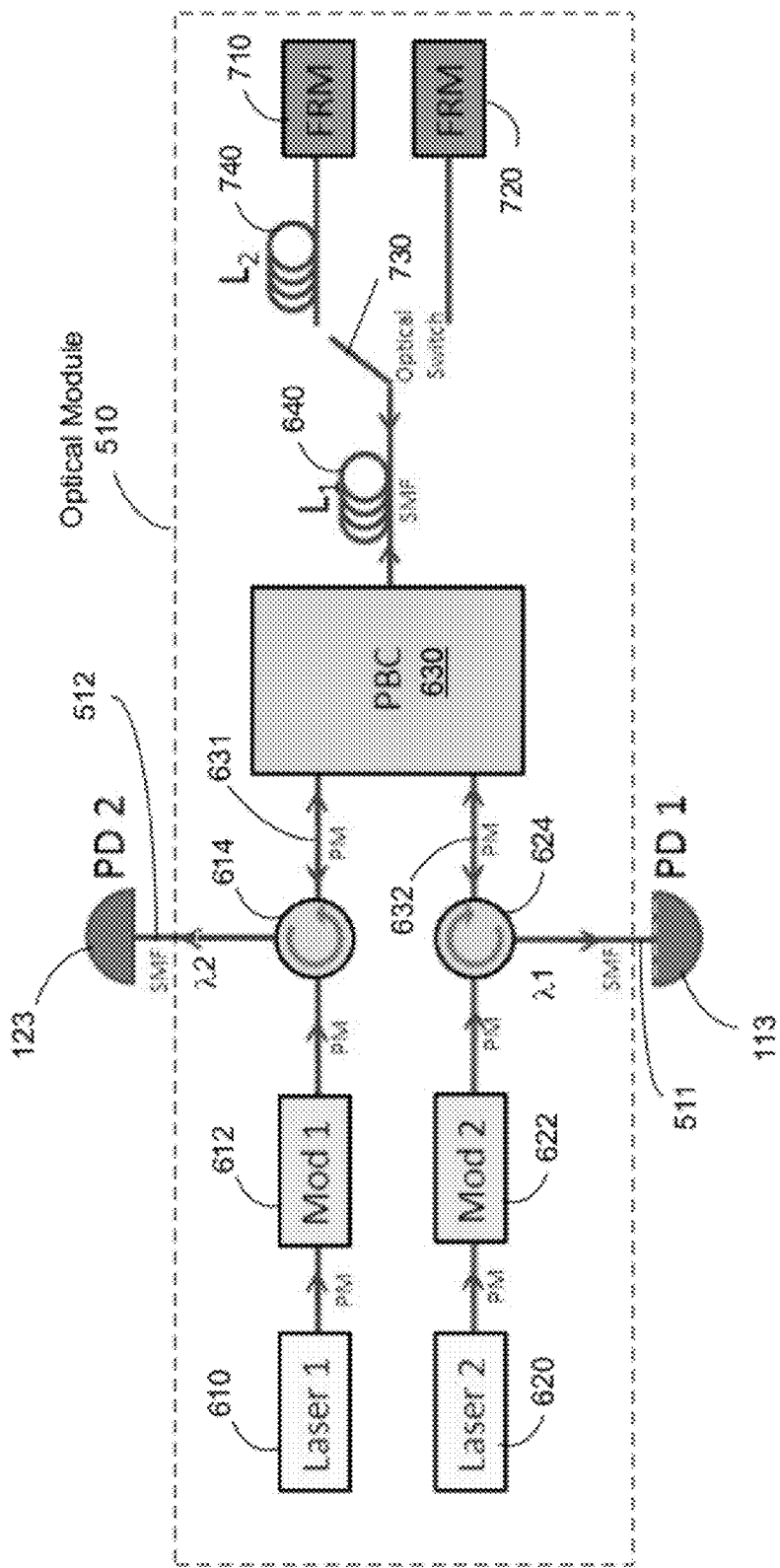

FIG. 7 shows another example of the polarization-based optical module 510 in which two FRMs 710 and 720 are used to provide two alternative optical paths for linking to the fiber delay line 640. An optical 1×2 switch 730 is provided to connect the fiber delay line 640 to either one of the two FRMs 710 and 720 to provide two different optical delays. In the example in FIG. 7, a second fiber delay line 740 is coupled between the optical switch 730 and the FRM 710 so the optical delay for light reflected by the FRM 710 is greater than the optical delay for light reflected by the FRM 720. The optical switch 730 is operated to switch between fibers of two different total fiber lengths L1 and (L1+L2), respectively, and to effectuate fiber lengths are 2×L1 and 2×(L1+L2) due to the double pass configuration by using the two FRMs 710 and 720.

The design in FIG. 7 can be extended to a multi-fiber length PNTS with more than two FRM paths to eliminate artificial spurs at harmonics of the frequency related with the fiber length. A single 1×N optical switch is used to switch between N fiber paths with different delays and respective FRMs.

Figure 8:
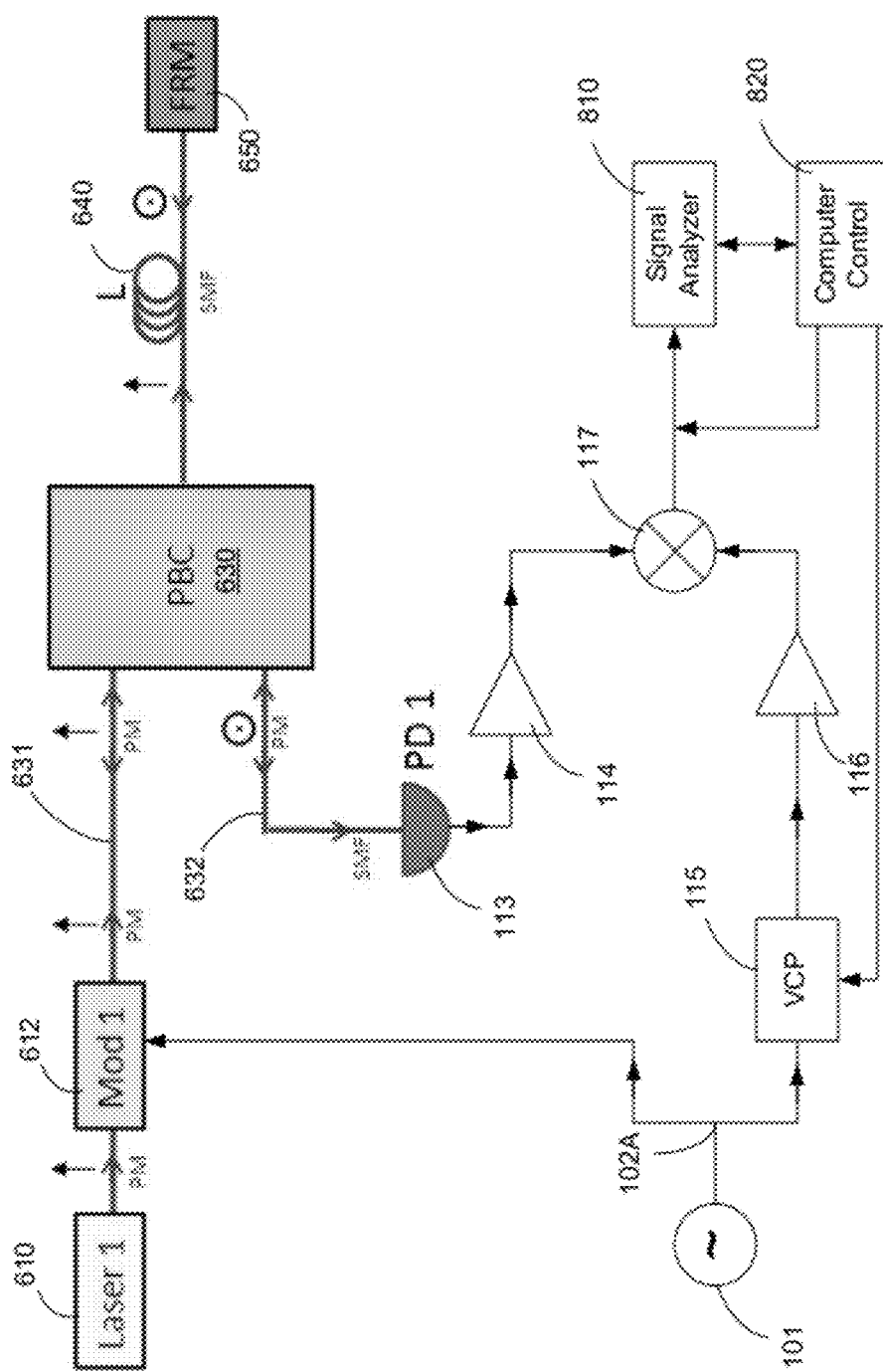

The above use of the FRM can be implemented in a single channel PNTS shown in FIG. 8. In this example, the polarization of the laser light is controlled based on the polarization control in FIGS. 6A, 6B and 7 without the optical circulators. The savings in this case is one half of the fiber length that would have otherwise required in a single channel. Similarly to the design in FIG. 7, two or more optical paths with FRMs and different delays can be implemented in FIG. 8 by using a single 1×N switch to switch between N fibers.

The single channel PNTS shown in FIG. 8 includes a signal analyzer 810 that receives the beat signal from the mixer 117 and produces FFT data of the received beat signal. A computer control 820 is used to send control signals to the VCP 115 to sweep the bias voltages over the VCP 115. The computer control 820 is also in communication with the mixer 117 to record the mixer output voltage responses through an analog-to-digital (A/D) conversion card. Calibration and quadrature setting procedures are performed before performing the phase noise measurements The techniques and designs in FIGS. 5 through 8 can be used to provide photonic phase noise measurement systems that reduce the physical length of the fiber delay line based on the double pass configuration using optical polarization. For cross-correlation systems, this configuration delivers together two signals, each having different (orthogonal) polarization, in a single fiber. A PBC is used for combining the two signals into a single fiber with the orthogonal polarizations. PM optical circulators, together with FRM, allow for separating the two polarizations into two photodetectors after traveling twice in a quarter of the fiber length that would otherwise be required to achieve similar performance of noise floor. This configuration can significantly reduce the physical size of phase noise measurement systems.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described.

What is claimed is:

1. A device for measuring a phase noise in a signal, comprising:
   an input port that receives an oscillation signal from an oscillator under test;
   a photonic signal processing circuit that processes the oscillation signal to produce an output signal; and
   circuitry that receives and processes the output signal to measure noise in the received oscillation signal and controls the photonic signal processing circuit and measurements of the noise in the received oscillation signal,
   wherein the photonic signal processing circuit includes:
   (a) a laser producing continuous wave laser light in a first optical polarization,
   (b) an optical modulator that modulates the laser light to produce modulated laser light that carries the oscillation signal and is in the first optical polarization,
   (c) a photonic beam combiner that:
      i. receives at a first port the modulated laser light in the first optical polarization along a first optical path from the optical modulator,
      ii. directs the received modulated laser light in the first optical polarization to a second port, and
      iii. directs light received at the second port in a second optical polarization orthogonal to the first optical polarization to a third port,
   (d) a fiber delay line coupled to the second port to receive light from the photonic beam combiner,
   (e) a Faraday rotator mirror coupled to the fiber delay line to reflect light back to the fiber delay line by rotating optical polarization by 90 degrees,
   (f) a photodetector coupled to receive light from the third port of the photonic beam combiner to generate a detector signal,
   (g) a voltage controlled phase shifter that receives a copy of the oscillation signal and changes a phase of the copy of the oscillator signal to produce a phase-shifted oscillator signal, and
   (h) a signal mixer that mixes the detector signal and the phase-shifted oscillator signal to produce the output signal.

2. The device as in claim 1, comprising:
   a polarization maintaining fiber that connects the optical modulator and the first port of the photonic beam combiner to maintain light in the first optical polarization.

3. The device as in claim 1, comprising:
   an optical switch coupled between the fiber delay line and the Faraday rotator mirror to connect or disconnect a connection between the fiber delay line and the Faraday rotator mirror;
   a second fiber delay line separated from the first fiber delay line; and
   a second Faraday rotator mirror coupled to the second fiber delay line to receive light from the second fiber delay line and to reflect light back to the second fiber delay line by rotating optical polarization by 90 degrees,
   wherein the optical switch is further coupled between the fiber delay line and the second fiber delay line to connect or disconnect a connection between the fiber delay line and the second fiber delay line.

4. The device as in claim 1, wherein the circuitry includes:
a signal analyzer that receives and processes the output signal to measure noise in the received oscillation signal; and
a controller that controls the first photonic signal processing circuit and the signal analyzer to control measurements of the noise in the received oscillation signal.

* * * * *